United States Patent

Yukami

[15] 3,699,405

[45] Oct. 17, 1972

[54] A STRESS SENSITIVE SEMICONDUCTOR ELEMENT HAVING A REDUCE CROSS-SECTIONAL AREA

[72] Inventor: Noboru Yukami, Hirakata, Japan

[73] Assignee: Matsushita Electric Industrial Co., Ltd., Osaka, Japan

[22] Filed: Nov. 2, 1971

[21] Appl. No.: 194,996

Related U.S. Application Data

[63] Continuation of Ser. No. 843,593, July 22, 1969, abandoned.

[30] Foreign Application Priority Data

| | | |
|---|---|---|
| July 29, 1968 | Japan | 43/54150 |
| Nov. 20, 1968 | Japan | 43/85749 |
| April 12, 1969 | Japan | 44/31819 |

[52] U.S. Cl. ......317/235 R, 317/235 M, 317/235 AJ, 317/235 AM, 317/235 AN

[51] Int. Cl. ..........................H01l 11/00, H01l 15/00

[58] Field of Search.........317/234, 235, 26, 48, 48.4, 317/48.3, 47; 29/588

[56] References Cited

UNITED STATES PATENTS

| | | | |
|---|---|---|---|
| 3,215,568 | 11/1965 | Pfann | 317/234 |
| 3,532,910 | 10/1970 | Lee et al. | 317/234 |
| 3,550,094 | 12/1970 | Norton | 317/235 |

FOREIGN PATENTS OR APPLICATIONS

| | | | |
|---|---|---|---|
| 1,354,527 | 1/1964 | France | 317/235 |
| 1,513,861 | 2/1968 | France | 317/235 |

*Primary Examiner*—James D. Kallam
*Assistant Examiner*—Andrew J. James
*Attorney*—Stevens, Davis, Miller & Mosher

[57] ABSTRACT

A stress sensitive semiconductor element comprising first and second low-resistivity regions of different conductivity types formed in a common semiconductor substrate, a third region of a high resistivity the conductivity type of which is the same as that of said second region, said third region being formed in said common semiconductor substrate in contact with said first and second regions, the junction between said first region and said third region being made deeper and that between said second region and said third region being made shallower, wherein a constricted potion is provided at the center of which substantially corresponds to the junction between said first region and said second region, and the distance from the junction between the third region and the first region to that between the third region and the second region is made substantially equal to or longer than the effective diffusion length of a carrier.

4 Claims, 13 Drawing Figures

FIG. 1a1, FIG. 1b1, FIG. 1b2, FIG. 1b3, FIG. 1c1, FIG. 1c2, FIG. 1c3, FIG. 1d1, FIG. 1d2

N. YUKAMI
INVENTOR

BY Stevens, Davis, Miller & Mosher
ATTORNEYS

STRESS SENSITIVE SEMI-CONDUCTOR ELEMENT HAVING A REDUCE CROSS-SECTIONAL AREA

This is a continuation, of application Ser. No. 843,593, filed July 22, 1969.

This invention relates to a stress sensitive semiconductor element, and it is intended to provide such an element having a high sensitivity and improved linearity.

Among the conventional stress-electricity transducer elements are those utilizing the piezo-resistance effect of a semiconductor bulk and those utilizing the stress-resistance effect of a PN junction.

The element utilizing the piezo-resistance effect of a semiconductor bulk is advantageous in that it exhibits linear relationship between stress and resistance variation, but it has a drawback in that the sensitivity or rate of change of resistance with respect to stress is low.

With the element utilizing the stress-resistance effect of a PN junction, on the other hand, the resistance is changed logarithmically with stress so that the resistance is remarkably varied upon application of a stress in excess of a certain critical value. Such critical value of stress is very close to the breakdown limit of the element per se. Technically, therefore, much difficulty is experienced in an attempt to put such type of element to practical use. Furthermore, the resistivity of a semiconductor substrate in which such PN junction is selected has to be a very low value, and the PN junction is formed in the substrate in a position very close to the surface thereof. This is in order to utilize a diffusion current flowing through the semiconductor substrate. Such element finds only limited use due to the fact that the mode of imparting a stress to the PN junction is limited to compression. Also, it is very liable to be influenced by external factors.

Accordingly, it is an object of the present invention to provide a novel improved stress-electricity transducer element having only the advantages of those utilizing the piezoresistance effect of a semiconductor bulk and those utilizing the stress-resistance effect of a PN junction, thereby solving the aforementioned problems. In principle, the element according to the present invention is based upon an entirely new idea.

Other objects, features and advantages of the present invention will become apparent from the following description taken in conjunction with the accompanying drawings, in which:

FIGS. $1a_1$ to $1d_2$ are views useful for explaining a variety of stress transducing semiconductor elements embodying the present invention, wherein FIG. $1a$ shows a plan view thereof and FIGS. $1b_1$ to $1c_3$ show sectional views thereof respectively, from which it will be seen that various forms of such elements are possible such as those being made uniform in the direction of thickness (FIGS. $1b_1$, $1c_1$ and $1d_1$), those being constricted only at the bottom (FIGS. $1b_2$ and $1c_2$) and those being constricted both at the top and bottom (FIGS. $1b_3$, $1c_3$ and $1d_3$), all these elements being widthwise constricted in opposite directions.

Figure 1:
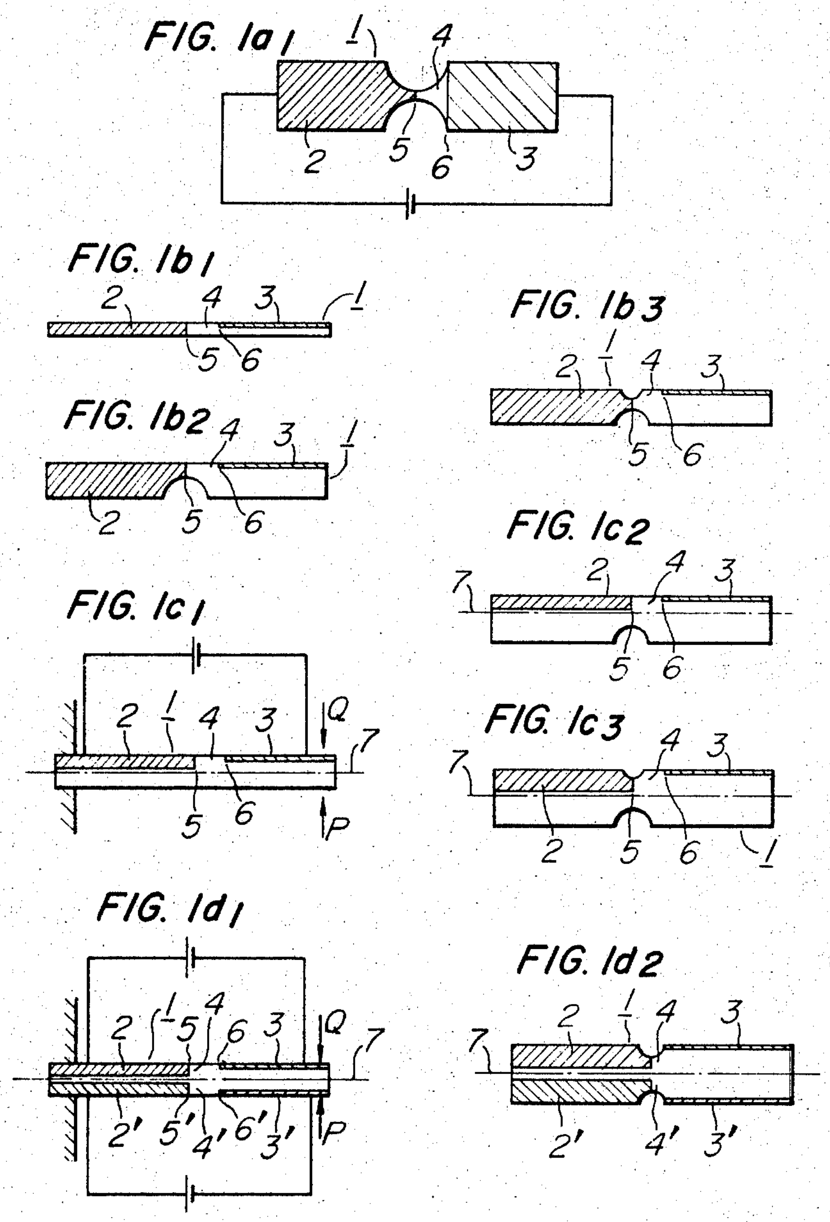

Detailed description will now be made of the element according to the present invention. FIGS. $1a$, $1b_1$, $1b_2$, $1b_3$, $1c_1$, $1c_2$, $1c_3$ and $1d_1$, $1d_2$ show an example of the construction of the present element, wherein numeral 1 represents a thin sheet-like silicon substrate 2,000 microns in length, 500 microns in width and 30 microns in thickness in the case of FIGS. $1b_1$, $1b_2$ and $1b_3$ and 100 microns in thickness in the case of FIGS. $1c_1$, $1c_2$, $1c_3$, $1d_1$ and $1d_2$ which is constricted in the center portion thereof. Numeral 4 indicates an N type region having a resistivity of several Ω-cm to several thousand Ω-cm, and it adjoins a P type region 2 having a low resistivity at a PN junction 5 which is formed in the neighborhood of the center of the constricted part or in the vicinity of the center of the substrate 1. In some cases, it is possible to further enhance the sensitivity by locating the PN junction slightly left-wardly of the most constricted part as viewed in the drawing so as to increase the length of the N type region having a high resistivity. The resistivity of the P type region 2 is 0.005 Ω-cm. In the case of FIGS. $1b_1$, $1b_2$ and $1b_3$, boron is selectively diffused into the substrate from one or both of the main surfaces thereof in such a manner as to penetrate therethrough or substantially therethrough. In the case FIG. $1c_1$, $1c_2$ and $1c_3$, boron is selectively diffused into the substrate from one of the main surfaces thereof, with the diffusion depth being limited to one-half or less of the thickness of the constricted portion. In the case of FIGS. $1d_1$ and $1d_2$, boron is selectively diffused into the substrate from both of the main surfaces thereof, with the depths of diffusion in the upper and lower portions being limited to one-half or less of the thickness of the constricted portion. The elements shown in FIGS. $1d_1$ and $1d_2$ include regions 2′, 3′, 4′, 5′ and 6′ corresponding to regions 2, 3, 4, 5 and 6, respectively but description thereof will be omitted. Numeral 3 denotes an N type region which is formed by diffusing phosphorus into the substrate 1 to a depth of 2 microns from one of the surfaces thereof over a range of 850 microns from the rightmost end of the substrate as viewed in the drawing. The resistivity of this N type region 3 is 0.001 Ω-cm. The length of the region 4 of a high resistivity formed in the center portion of the substrate 1 or the distance between the junctions 5 and 6 is selected to be longer or substantially equal to the effective diffusion length of the carrier. The sectional area of the center portion is extremely small due to the fact that the notch is formed in directions perpendicular to the longitudinal direction of the substrate 1 so that the electrical characteristics of the element are greatly affected by the surface recombination, with a result that the effective carrier diffusion length is shortened.

Figure 2:
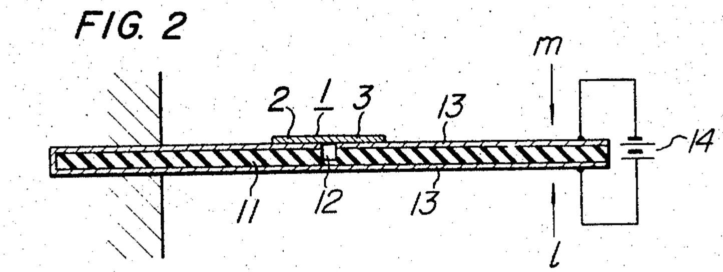
FIG. 2 is a view showing an example of a mode of application in which the element according to the present invention is used.

FIG. 2 shows a mode of use of the element shown in FIGS. $1b_1$, $1b_2$ and $1b_3$, wherein numeral 11 represents an insulating plate having a groove 12 formed in one surface. A metal layer 13 provided on the two main surfaces and one side edge of the insulator 11 is divided into two sections by the groove 12. The substrate 1 as shown in FIG. 1 is soldered to the metal layer across the groove 12 in such a manner that the P type region 2 thereof is electrically connected with one of the metal layer sections and the N type region 3 with the other metal layer section. Nickel or gold-chrome alloy is previously evaporated onto the surfaces of the P type region 2 and N type region 3 having a low resistivity. The insulating plate 11 is fixed at one end portion, and a DC power source 14 is electrically connected with the metal layer 13 in the forward direction with respect to the PN junction surface 5. The distance from the free end of the insulating plate 11 to the center of the groove 12 is 5,000 microns.

With such an arrangement, if the free end of the insulating plate 13 is bent in a direction as indicated by 1, a compressive force is imparted to the element 1, and if the free end is bent in a direction as indicated by *m*, a tensile force is imparted to the element. In such a case, the force applied to the element is a uniaxial force and not a bending force.

The elements shown in FIGS. $1c_1$, $1c_2$, $1c_3$, $1d_1$ and $1d_2$ eliminate the insulator 11 shown in FIG. 2. That is, the element 1 can be bent, with a line passing through the longitudinal center as a neutral axis 7, by bending in the direction indicated by P the free end of the element fixed at one end. More specifically, the upper half of the element above the neutral axis is subjected to a compressive force, and the lower half to a tensile force. Assume now that the depth of the P type region 2 is 30 microns and that the thickness of the constricted portion is 100 microns, for example. In that case, the PN junction 5 is located completely above the neutral axis so that is subjected to a compressive force resulting from the force imparted in the direction shown by P. By bending the element in the opposite direction shown by Q, a tensile force is imparted to the junction 5. Neither of the forces in the directions indicated by P and Q is imparted to the center line or neutral axis 7. Therefore, no expansion and contraction occur thereat. The elements shown in FIGS. $1d_1$ and $1d_2$ also follow the same principle as the above, although they include regions 2', 3', 4', 5' and 6' corresponding to the regions 2, 3, 4, 5 and 6 respectively. By bending each of these elements in the direction indicated by P, a compressive force is imparted to that portion which is above the neutral axis 7 and a tensile force to that portion which is therebelow. Each of these elements comprises symmetrical upper and lower sections which are simultaneously subjected to a compressive force and a tensile force respectively when a force is imparted to the element in one direction.

Figure 3:
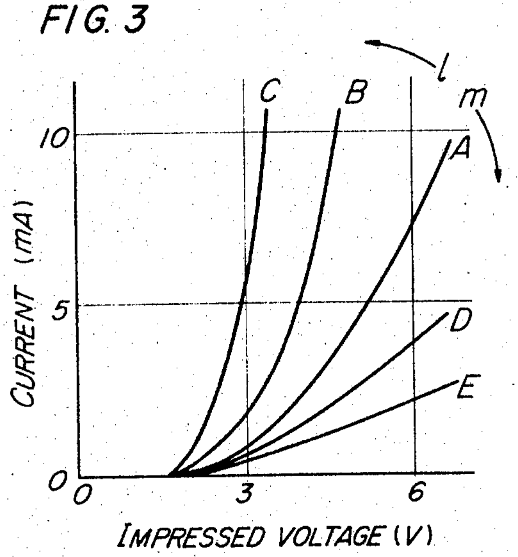
FIG. 3 is a view showing characteristic curves obtained with the arrangement of FIG. 2; and FIGS. $4a$ and $4b$ are a plane view and a sectional view showing the construction of an element which was manufactured for trial at a stage prior to the development of the element according to the present invention.

FIG. 3 shows variations in the forward characteristics of the element 1 when a force is applied to the free end of the insulation plate 11 or those of the elements shown in FIGS. $1c_1$, $1c_2$, $1c_3$, $1d_2$ and $1d_3$, wherein the curve A indicates the case where the force was 0gw, that is, no force was imparted to the element; the curves B and C indicate the cases where forces of 10gw and 20gw were applied in the direction indicated by *l* respectively; and the curves D and E indicate the cases where forces of 10gw and 20gw were applied in the direction indicated by *m* respectively.

In the case of the elements shown in FIGS. $1d_1$ and $1d_2$, the forward characteristics between the terminals 2 and 3 provided above the neutral axis are represented by the curves B and C, and those between the terminals 2' and 3' located below the neutral axis by the curves D and E. For a force in the direction indicated by Q, the relationships are reversed.

As will be seen from these characteristic curves, the most important feature of the element according to the present invention is that the rate of change of the current with respect to a predetermined stress depends upon the forward voltage so that the higher the voltage, the higher becomes the rate of change of the current. In the case of the conventional element utilizing the stress-resistance effect of a PN junction, on the other hand, a change of resistance or rate of current change as a stress is imparted to the PN junction remains substantially constant without depending upon a forward voltage. Thus, it will be readily apparent that the element according to the present invention is differentiated from the conventional one in respect of its characteristics. Advantageously, the present element represents a high rate of resistance change for a stress in a range of very low values. Furthermore, it is of no importance whether the direction of a stress is positive or negative.

Such distinction in characteristics of the present invention over the conventional one results from its construction wherein the PN junction is formed in the central constricted portion having a small sectional area and holes are injected with a high density into the N type region of a high resistivity of which the length is made to be substantially equal to or longer than the effective carrier diffusion length.

In this case, the following physical mechanism can be considered. By increasing the resistivity of the region 4 and suitably selecting the length thereof, the voltage drop across the region 4 becomes higher than that across the PN junction surface 5. As a result, a diffusion current and a drift current are caused to simultaneously flow through the region 4. At this point, the moving carrier is dominantly holes, and there are also electrons flowing to a certain extent. In this case, the voltage (V) vs. current (I) characteristic is given by $$I = I_c V^m \quad (1)$$

The current $I_c$ dependent upon the size of the element and the power *m* of the voltage V vary with stress. This variation is caused due to the fact that the effective carrier diffusion length $L_e$ is changed. That is, since the current $I_c$ is given by a high order function of the effective diffusion length $L_e$, it is varied at a much higher rate than the rate of change of the effective diffusion length $L_e$. The power *m* of the voltage V is also varied with the effective diffusion length $L_e$. Thus, even if the voltage V remains constant, the current $I_c$ is greatly varied with only a small variation of the power *m*. Equation (1) is represented by a straight line when it is plotted on a chart of a full logarithmic scale, and the slope of the straight line changes with a variation of the power *m*.

Thus, variations in the mobility $\mu$ and life time $\tau$ with the stress result in a variation of the effective diffusion length of the carrier, since the effective diffusion length of the carrier is given by a function of the mobility $\mu$ and life time $\tau$. As will be seen from the aforementioned reason, the current I is greatly varied with the variation of the effective diffusion length of the carrier. In this way, the sensitivity of the element is enhanced. In practice, the value of the power *m* is varied between 1 and 6 with the stress.

For reference, description will be made of the conventional PN junction. The relationship between current (I) and voltage (V) is given by $$I=q(D_p p_n/L_p+D_n n_p/L_n)(e^{qV/kT}-1) \quad (2)$$

where $I$ : current $V$ : voltage $P_n$ : minority carrier (the number of holes in the N type region)

$n_p$ : minority carrier (the number of electrons in the P type region)

$D_p$, $D_n$ : diffusion coefficients of the hole and electron respectively $L_p$, $L_n$ : diffusion lengths of the hole and electron respectively $q$ : charge $k$ : Boltzman's constant In the case where variations of the diffusion current as represented by Equation (2) are utilized, the quantities of the minority carriers or the values of $P_n$ and $n_p$ are changed upon application of a stress, so that the current $I$ is changed. The change of the current is not started until the stress reaches a value in the vicinity of the breakdown limit of the element per se, as described above.

Comparison of Equations (1) and (2) evidently shows that the physical mechanisms for the variations in the current $I$ with a stress represented by these two equations are basically different from each other. In the case of Equation (1), the factor $I_c$ is given by a high order function of the effective diffusion length of the carrier, and the power $m$ of the voltage $V$ is also varied with a stress. From this, it will be appreciated that the current varying mechanism represented by Equation (1) is more advantageous for a transducing element.

Figure 4A:
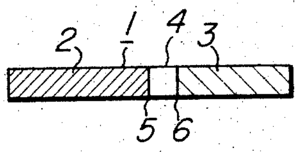
Figure 4B:
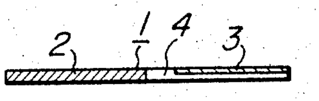

Description will now be made of the advantages of the construction wherein the element is constricted in the center portion thereof as shown in FIG. 1 over the construction wherein the element has a uniform thickness as shown in FIG. 4. By forming a PN junction in the substantially central part of the constricted fine portion, the holes from the P type region 2 of a low resistivity are injected at the junction 5 having a small sectional area and suddenly expanded into the portion having a large sectional area or the portion of a low surface recombination rate. In the case of electrons injected from the low resistivity N type region 3 into the high resistivity N type region 4, the injection takes place at the junction 6 having a great sectional area so that the electrons are caused to suddenly flow into the portion having a small sectional area or the portion of a high surface recombination rate. Thus, the number of electrons arriving at the finest part of the constricted portion is reduced so that the stress-resistance effect of holes injected into the high resistivity N type region 4 becomes dominant, thus resulting in an enhanced sensitivity. This means that the present element is physically different from the element of FIG. 4 which is made to be uniform in thickness, without being provided with any constricted portion. It is not only for the purpose of facilitating the attachment of electrical lead-out means such as soldering but also for the purpose of enhancing the sensitivity that the opposite ends of the element are made thick as shown in FIG. 1. It is presumed that such a configuration plays an important role.

Further, the region 2 is formed by a deep diffusion (30 microns) of boron, and the region 3 is formed by a shallow diffusion (2 microns) of phosphorus, so that the junction 5 is made deep and the junction 6 is made shallow. This is of a great physical importance. In the case of the element shown in FIG. $1b_1$, for example, two PN junctions 5 which vertically and horizontally extend respectively will be formed, if the region 2 is not extended through the entire thickness of the element. Holes injected from the horizontal PN junction will be subjected to recombination before they reach the constricted portion because the horizontal PN junction and the constricted portion. Furthermore, if the vertical junction 5 is shallow, the quantity of holes injected therefrom will decrease. Thus, the shallower the region 2, the less becomes the quantity of holes passing through the constricted portion. The influences of a stress on a hole and an electron are directed in opposite directions so as to be cancelled out each other. In order to enhance the sensitivity of the element, therefore, it is necessary to make only one type of carrier pass through the constricted portion as far as possible. Preferably, such carrier is holes in this case. In order to prevent the carrier from being becoming extinct due to recombination, it is essential to inject holes at the center of the constricted portion. For this purpose, it is necessary to make the junction 5 as deep as possible. (Naturally, limitation is laid in the case of the elements shown in FIGS. $1c_1$, $1c_2$, $1c_3$, $1d_1$ and $1d_2$.) On the other hand, it is necessary to prevent electrons from reaching the constricted portion as far as possible. For this reason, the region 3 should be made shallow to make the junction 6 as shallow as about 1 to 2 microns.

By making the minimum sectional area of the constricted portion smaller than 5,000 square microns, the stress-electricity conversion efficiency tends to be improved. This can be deduced from the fact that if the sectional area is reduced, then the effective life time of the carrier is more greatly influenced by the life time of the carrier in the surface than that within the bulk. That is, the effective life time of the carrier is influenced by the surface recombination at the surface level, and the rate of recombination in the surface is greatly changed by a stress, thus resulting in an enhanced stress-electricity conversion efficiency.

In FIG. 1, the PN junction is formed at a position spaced leftwardly apart from the center of the constricted portion by 10 to 50 microns as viewed in the drawing, and holes are injected with a high density into the center of the constricted portion or the finest part of the substrate 1 to cause conductivity-modulation. Such construction contributes to decrease the impedance between the terminals and yet increase the substantial rate of resistance change ($\Delta R/R_o$), where $R_o$ indicates the electric resistance when no stress is applied, and $\Delta R$ a change of the resistance which is caused when a stress is applied.

Here, there arises a problem of the voltage distribution between the PN junction and the bulk. The resistance of the PN junction depends upon a voltage applied thereto. Assume that the resistance of the semiconductor bulk is decreased with a stress, then the voltage drop across the bulk portion becomes lower so that a correspondingly higher voltage is imparted to the PN junction portion. If a high forward voltage is imparted to the PN junction, then the resistance thereof is decreased. Thus, if only the resistivity of the bulk portion is decreased with a stress, this results in a decrease of the PN junction area. The very reverse of this can be said if the resistance of the semiconductor bulk is increased with a stress. That is, a variation in the voltage distribution with a stress has a multiplication effect on the sensitivity.

As to the axial direction of the crystal, it has been experimentally confirmed that the highest possible sensitivity can be achieved by applying a stress to the element by flowing a current in the direction of the [111] axis in the case where use is made of an N type silicon substrate as in FIG. 1. This is completely different from the case of the conventional PN junction. It is deduced that the most suitable axial direction is the direction of the [100] axis in such a construction that use is made of a P type silicon substrate, a low resistivity N type region is formed by deeply diffusing phosphorus into the region 2 and a low sensitivity P type region is formed by shallowly diffusing boron into the region 3. In this case, however, the decrease and increases in the current with the stress become reverse to those described above.

In the element having the aforementioned construction, a stress-resistance effect like that of a P type semiconductor can be obtained in the case where use is made of an N type semiconductor substrate. It is well known in the art that when an ohmic current or electrons are caused to flow through an N type semiconductor as a carrier, a compression force is produced by which the resistivity is increased. In contrast, in the case of the element according to the present invention, the resistivity is decreased by such a compression force. This is because of the distortion effect of the holes injected into the N type region. This shows that an entirely novel mechanism occurs, coupled with the distortion effect of double injection.

As described above, in accordance with the present invention, there is provided a stress converting element wherein a high-resistivity region is provided between two regions of different conductivity types in contact therewith, the distance between the two junctions being approximately equal to or longer than the effective diffusion length of the carrier, and a PN junction is formed in the most constricted part or a position closer to that one of the regions on the opposite sides which is of a different conductivity type. The sectional area of the most constricted part was described as 5,000 square microns or less. In practice, however, it is preferably 3,000 square microns or less. From the standpoint of the manufacturing technique, the lower limit of the sectional area is several hundred square microns to 1,000 square microns. If the sectional area is less than this range, difficulty will be encountered in the manufacture, thus resulting in lower accuracy.

With the present element, it is possible to achieve a sensitivity which is remarkably higher than, say 10 to 1,000 times of that of the conventional one utilizing the piezo-resistance effect of a bulk, in a range of a low stress. In the conventional element wherein a stress is imparted to the PN junction, it is required that a high stress close to the breakdown limit be applied as an initial stress. This makes it very difficult to utilize such an element as a practical device. Therefore, the conventional element described above has never been provided as an actual product. In contrast, the element according to the present invention requires no initial stress. Thus, the present element has such advantages that it can be very easily manufactured on a mass production basis.

A further advantage of the present element is that the resistance between the terminals is varied linearly with the stress.

Furthermore, the elements shown in FIG. 1$c_1$, 1$c_2$, 1$c_3$, 1$d_1$ and 1$d_2$ require no base plate to impart a uniaxial force thereto. This is because by bending only the element, a unidirectional force, compressive or tensile, is imparted thereto, thereby resulting in an enhanced sensitivity since the PN junction is located above or below the neutral axis. In addition, these elements are advantageous over those shown at $b_1$, $b_2$ and $b_3$ in respect of manufacture and heat dissipation, because the sectional areas of the constricted portions of the former are wider than those of the latter. In handling, it is sometimes convenient that these elements are mounted on such a base plate as shown in FIG. 2. Therefore, these elements should be used properly in accordance with the intended purpose.

The elements shown in FIGS. 1$b_2$, 1$b_3$, 1$c_2$, 1$c_3$ and 1$d_2$ each having a uniform thickness are easy to handle, and possess a high mechanical strength as compared with those shown in FIGS. 1$b_1$, 1$c_1$ and 1$d_1$ each having a constriction in the direction of thickness.

Each of the elements shown in FIGS. 1$d_1$ and 1$d_2$ simultaneously provides a terminal of which the electrical resistance is decreased by a unidirectional pressure and a terminal of which the electrical resistance is increased thereby.

The general feature of the foregoing elements is that an extremely high sensitivity and a good linearity can be achieved without requiring any initial stress. The present invention may be embodied into various forms of elements as shown in FIG. 1, and such various elements may be used properly in accordance with the intended purpose.

What is claimed is:

1. A stress sensitive semiconductor element comprising: a semiconductive substrate having a portion of reduced cross-sectional area formed therein; a first region having a first conductivity type formed in said substrate; a second region having a second conductivity type different from said first conductivity type formed in said substrate, and a third region of higher sensitivity than said first and second regions formed in said substrate between said first and second regions, and the conductivity type of said third region being the same as that of said second region; wherein a first junction is formed between said first and third regions extends into said substrate deeper than a second junction formed between said second and third regions, said first junction extending into said reduced cross-sectional portion and having a cross-sectional area substantially different from that of said second junction; and wherein the distance through said third region between said first and second junctions is not less than the effective diffusion length of a carrier.

2. A stress sensitive semiconductor element according to claim 1, wherein said first junction is located in the smallest cross-sectional area of said substrate.

3. A stress sensitive semiconductor element according to claim 1, wherein said first junction is displaced from the point of smallest cross-sectional area of said substrate in the direction of said first region.

4. A stress sensitive semiconductor element according to claim 1, wherein the smallest area of said reduced cross-section portion is less than five thousand square microns.

* * * * *